United States Patent
Zhou et al.

(10) Patent No.: US 12,238,906 B2
(45) Date of Patent: *Feb. 25, 2025

(54) POWER ELECTRONIC DEVICE ASSEMBLIES HAVING HEAT SPREADERS AND ELECTRICALLY INSULATING LAYER

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 196 days.

This patent is subject to a terminal disclaimer.

(21) Appl. No.: 18/155,464

(22) Filed: Jan. 17, 2023

(65) Prior Publication Data
US 2024/0244805 A1    Jul. 18, 2024

(51) Int. Cl.
*H05K 1/02* (2006.01)
*H05K 1/18* (2006.01)
*H05K 7/20* (2006.01)

(52) U.S. Cl.
CPC ....... *H05K 7/20927* (2013.01); *H05K 1/0204* (2013.01); *H05K 1/185* (2013.01); *H05K 7/20254* (2013.01); *H05K 7/20272* (2013.01)

(58) Field of Classification Search
CPC . H01L 23/3735; H01L 23/473; H01L 23/367; H01L 23/5383; H01L 23/5389; H01L 23/5384; H01L 23/3736; H01L 2924/1517; H01L 31/024; H01L 2224/24137; H01L 2224/32225;
(Continued)

(56) References Cited

U.S. PATENT DOCUMENTS

| | | |
|---|---|---|
| 6,184,463 B1 | 2/2001 | Panchou et al. |
| 2005/0139995 A1 | 6/2005 | Sarraf et al. |

(Continued)

FOREIGN PATENT DOCUMENTS

| | | |
|---|---|---|
| CN | 111690963 A | 9/2020 |
| DE | 3930858 A1 | 3/1990 |

(Continued)

OTHER PUBLICATIONS

Copper-graphite-copper sandwich: superior heat spreader with excellent heat-dissipation ability and good weldability (https://pubs.rsc.org/en/content/articlelanding/2016/ra/c6ra00057f).

*Primary Examiner* — Mandeep S Buttar
(74) *Attorney, Agent, or Firm* — DINSMORE & SHOHL LLP (57) ABSTRACT

Power electronics device assemblies, circuit board assemblies, and power electronics assemblies are disclosed. In one embodiment, a power electronics device assembly includes an S-cell including a first metal layer comprising a first surface having a recess, a first graphite layer bonded to the first metal layer, a second metal layer bonded to the first graphite layer, a solder layer disposed on the second metal layer, and an electrically insulating layer bonded to the solder layer. The power electronics device assembly may further include a power electronics device disposed within the recess of the first surface of the first metal layer.

20 Claims, 5 Drawing Sheets

(58) Field of Classification Search
CPC ...... H01L 2924/15153; H05K 7/20254; H05K 7/20927; H05K 1/185; H05K 1/0204; H05K 1/0206; H05K 1/05; H05K 7/209; H05K 1/0298; H05K 7/20509; H05K 1/0203; H05K 7/2089; H02M 7/003
USPC ........................................................ 361/702
See application file for complete search history.

(56) References Cited

U.S. PATENT DOCUMENTS

| | | | |
|---|---|---|---|
| 2015/0262904 A1* | 9/2015 | Hung .................. | H01L 25/0657 |
| | | | 257/713 |
| 2020/0152557 A1* | 5/2020 | Lim ........................ | H01L 24/24 |
| 2020/0295474 A1* | 9/2020 | Vockenberger ...... | H01R 4/4821 |
| 2022/0157693 A1* | 5/2022 | Zhou ........................ | H01L 25/50 |
| 2023/0038624 A1* | 2/2023 | Pierart ............... | A61B 5/14532 |
| 2023/0307406 A1* | 9/2023 | Zhou .................. | H05K 7/20927 |
| 2024/0038624 A1* | 2/2024 | Zhou .................. | H05K 7/20254 |
| 2024/0258191 A1* | 8/2024 | Zhou ..................... | H01L 23/373 |

FOREIGN PATENT DOCUMENTS

| | | |
|---|---|---|
| JP | H11204672 A | 7/1999 |
| WO | 2021039816 A1 | 3/2021 |

* cited by examiner

POWER ELECTRONIC DEVICE ASSEMBLIES HAVING HEAT SPREADERS AND ELECTRICALLY INSULATING LAYER

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, a power electronics device assembly is disclosed. The power electronics assembly includes an S-cell including a first metal layer comprising a first surface having a recess, a first graphite layer bonded to the first metal layer, a second metal layer bonded to the first graphite layer, a solder layer disposed on the second metal layer, and an electrically insulating layer bonded to the solder layer. The power electronics device assembly may further include a power electronics device disposed within the recess of the first surface of the first metal layer.

In another embodiment, a circuit board assembly is disclosed. The circuit board assembly includes a substrate that is electrically insulating, and a power electronics device assembly fully embedded in the substrate. The power electronics device assembly includes The power electronics assembly includes an S-cell including a first metal layer comprising a first surface having a recess, a first graphite layer bonded to the first metal layer, a second metal layer bonded to the first graphite layer, a solder layer disposed on the second metal layer, and an electrically insulating layer bonded to the solder layer. The power electronics device assembly may further include a power electronics device disposed within the recess of the first surface of the first metal layer.

In yet another embodiment, a power electronics assembly is disclosed. The power electronics assembly includes a cold plate and a circuit board assembly affixed to a first surface of the cold plate. The circuit board assembly includes a substrate that is electrically insulating and a power electronics device assembly fully embedded in the substrate. The power electronics assembly includes an S-cell including a first metal layer comprising a first surface having a recess, a first graphite layer bonded to the first metal layer, a second metal layer bonded to the first graphite layer, a solder layer disposed on the second metal layer, and an electrically insulating layer bonded to the solder layer. The power electronics device assembly may further include a power electronics device disposed within the recess of the first surface of the first metal layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are generally directed to power electronics assemblies having one or more power electronics device assemblies embedded directly into a circuit board, such as a printed circuit board. By fully embedding the one or more power electronics device assemblies in the circuit board, an electrical insulation layer between the circuit board and a cold plate of the power electronics assembly may be removed because the power electronics devices are insulated by the substrate material of the circuit board (e.g., FR-4). Removal of the electrical insulation layer reduces the thermal resistance between the power electronics devices and the cold plate, thereby improving thermal performance. Further, removal of the electrical insulation layer also reduces the overall package size of the power electronics device assembly.

The power electronics device assemblies of the present disclosure comprise a power electronics device affixed to a mounting substrate referred to herein as an S-cell. As described in more detail below, the S-cell includes an electrically insulating layer that electrically insulates the bottom electrodes of the power electronics device from other components of the power electronics device assembly. For example, the integral electrically insulating layer of the S-cell enables the removal of the electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein comprise stacked metal, graphite, and one or more electrically insulating layers in a compact package.

The power electronic device assemblies, the circuit board assemblies, and the power electronics assemblies described herein may be used in electrified vehicles, such as and without being limited to, an electric vehicle, a hybrid electric vehicle, any electric motor, generators, industrial tools, household appliances, and the like. The power electronics assemblies described herein may be electrically coupled to an electric motor and/or a battery and be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device and includes one or more of a metal layer, a graphite layer and an electrically insulating layer.

Various embodiments of power electronics device assemblies, circuit board assemblies, and power electronics assemblies are described in detail below. Whenever possible, the same reference numerals will be used throughout the drawings to refer to the same or like parts.

Figure 1:
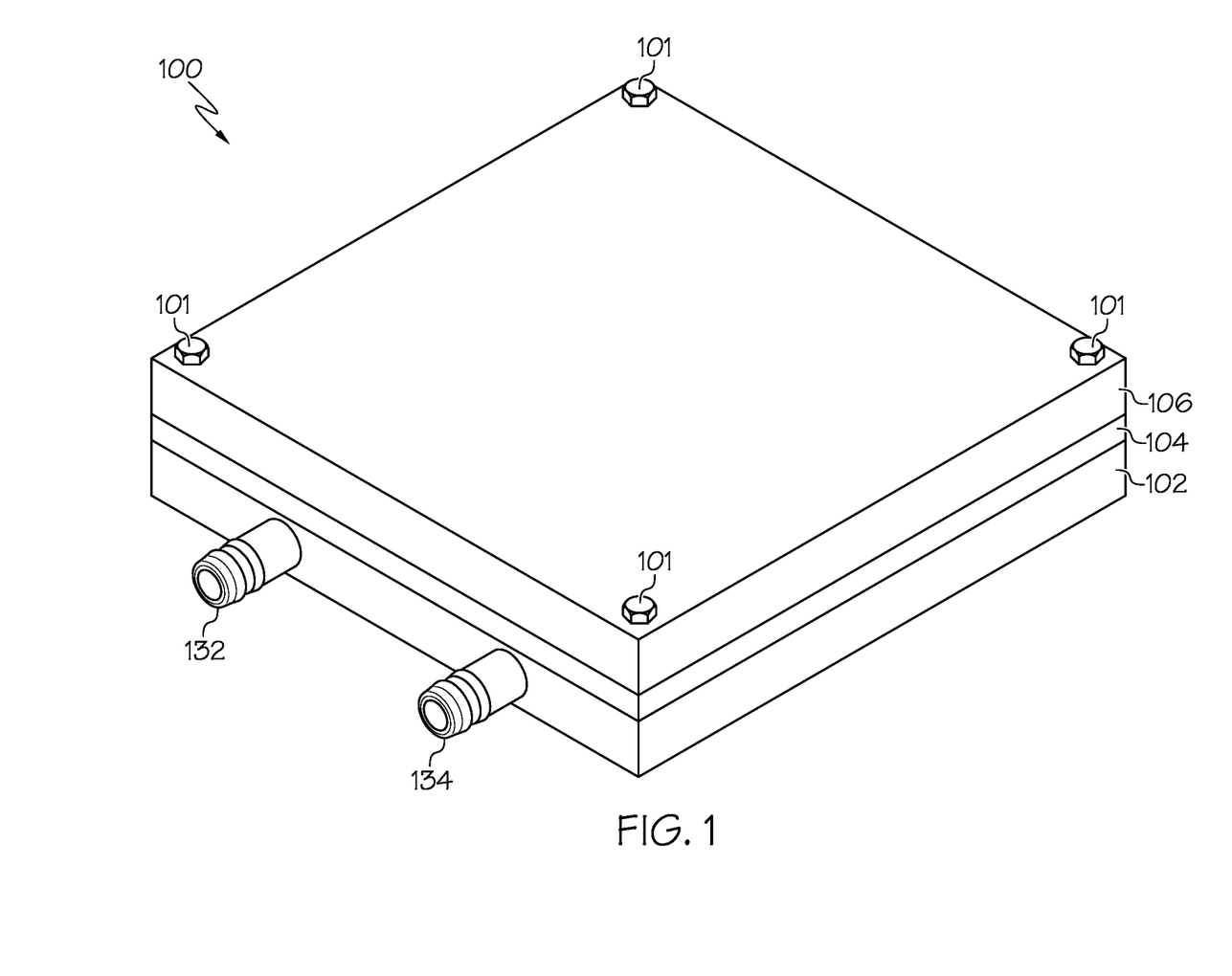
FIG. 1 schematically depicts a perspective view of a power electronics assembly, according to one or more embodiments described and illustrated herein.
Figure 2:
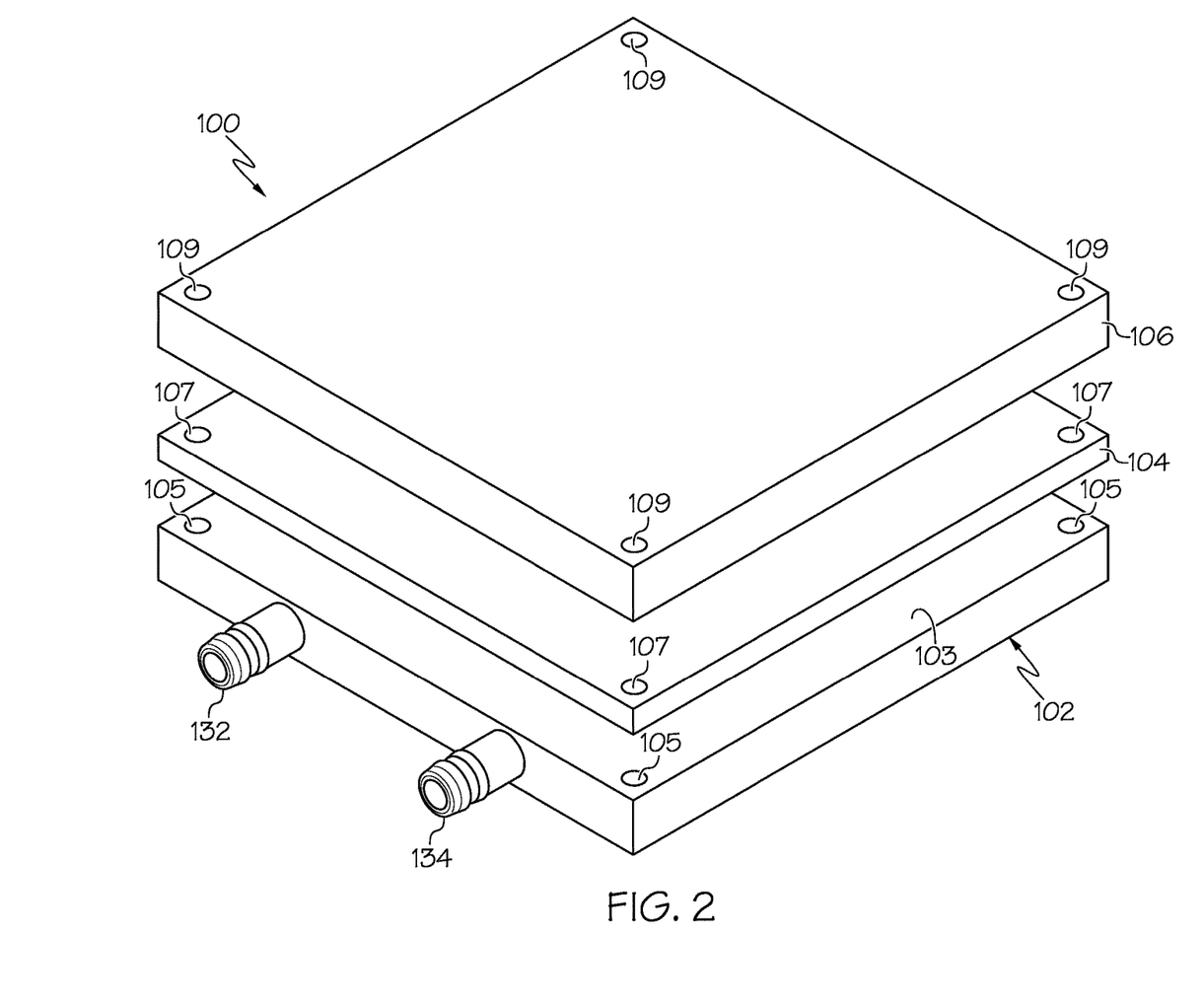
FIG. 2 schematically depicts an exploded perspective view of the example power electronics assembly illustrated by FIG. 1, according to one or more embodiments described and illustrated herein.
Figure 3:
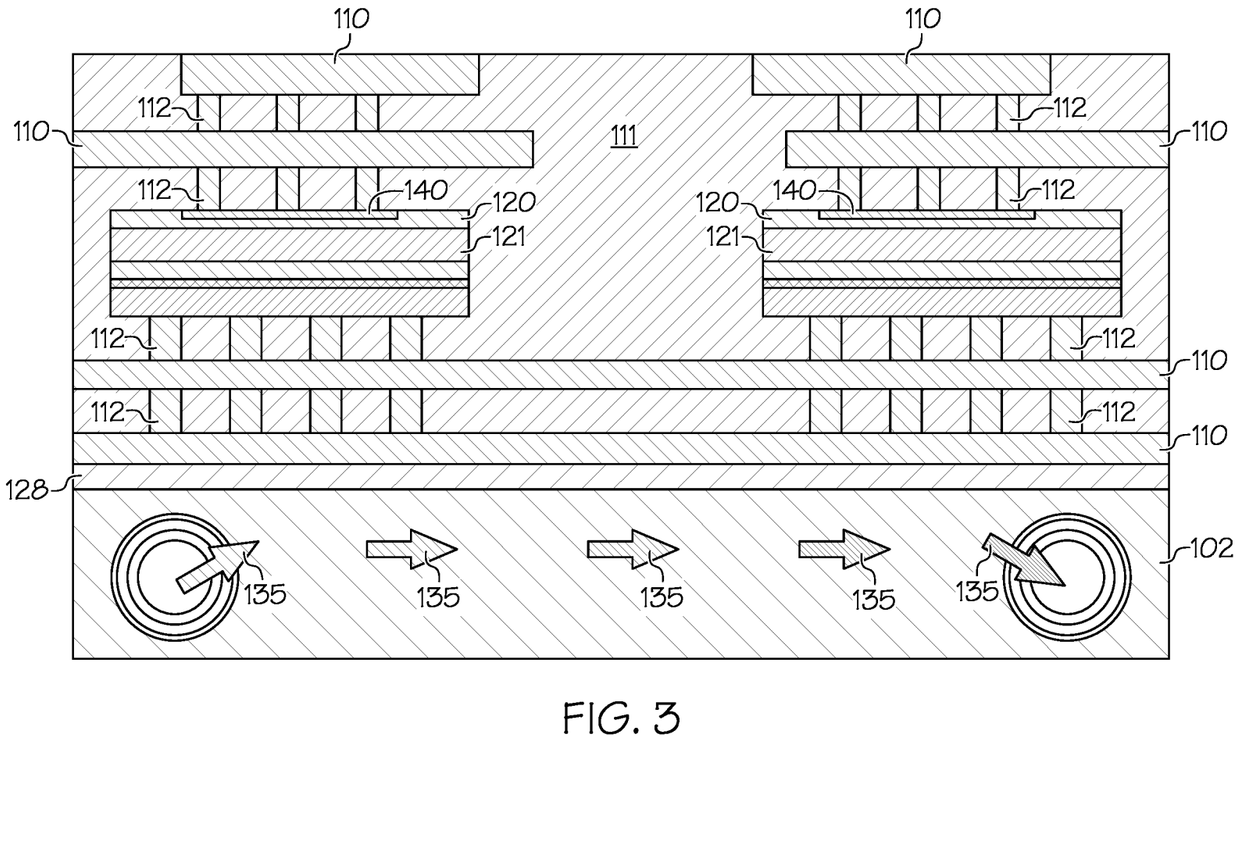
FIG. 3 schematically depicts a cross-sectional view of an example power electronics assembly, according to one or more embodiments described and illustrated herein.

Referring now to FIGS. 1 and 2, an example power electronics assembly 100 is illustrated in an assembled view and an exploded view, respectively. The power electronics assembly 100 illustrated by FIGS. 1 and 2 include a cold plate 102, a bond layer 104 (or in some embodiments a thermal grease layer), and a circuit board assembly 106. The cold plate 102 may be any device capable of removing heat flux from power electronics devices 140 (see FIG. 3) embedded within a substrate material of the circuit board assembly 106. Non-limiting examples for the cold plate include heat sinks, single-phase liquid cooling, two-phase liquid cooling, a vapor chambers. FIGS. 1 and 2 illustrate the cold plate 102 as being configured as a single-phase liquid cooling device. The cold plate 102 includes a fluid inlet 132 and a fluid outlet 134 fluidly coupled to a fluid chamber 115 within the cold plate 102. Referring briefly to FIG. 3, cooling fluid 135 from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135.

The circuit board assembly 106 is affixed to a first surface 103 of the cold plate 102. FIGS. 1 and 2 illustrate the circuit board assembly 106 as being affixed to the first surface 103 of the cold plate 102 by way of fasteners 101 (e.g., bolts and nuts) disposed through through-holes 105 of the cold plate 102, through-holes 107 of the bond layer 104, and through-holes of the circuit board assembly 106. When fasteners 101 are used, the bond layer 104 may be a thermal grease layer to lower the thermal resistance between the circuit board assembly 106 and cold plate 102. It is noted that the bond layer 104 configured as thermal grease will not have dedicated through-holes; through-holes 107 are shown for illustrative purposes.

In other embodiments, the circuit board assembly 106 is affixed to the first surface 103 of the cold plate 102 by a bond layer 104 configured as a solder layer. For example, the bottom surface of the circuit board assembly 106 may include a metal layer that enables the circuit board assembly 106 to be affixed to the first surface 103 of the cold plate 102 by a solder layer. It should be understood that other bonding methods may be utilized.

Referring now to FIG. 3, a cross-sectional view of the example power electronics assembly 100 is illustrated. The circuit board assembly 106 comprises a substrate 111 made of an electrically insulating material. The electrically insulating material may be a material used in the fabrication of printed circuit boards, such as, without limitation, FR-4. The circuit board assembly 106 further comprises embedded electrically conductive layers 110, a plurality of vias 112 (both electrically conducting vias and thermal vias), and a plurality of power electronics device assemblies 120.

As a non-limiting example the circuit board assembly 106 may include six power electronics device assemblies 120 for an inverter circuit for an electric vehicle, as will be described in more detail in reference to FIG. 6. However, it should be understood that any number of power electronics device assemblies may be utilized depending on the application.

Each power electronics device assembly 120 includes an S-cell 121 and a power electronics device 140 affixed to the S-cell 121. As stated above, the S-cell 121 is a substrate to which the power electronics device 140 is bonded. It provides electrically conductive surface area to make connections to electrodes on the bottom surface of the power electronics device 140. The S-cell 121 further provides heat spreading functionality as well as electrical isolation. By providing electrical isolation in the S-cell 121, a separate electrical isolation layer between the circuit board assembly 106 and the cold plate 102 is not needed, as will be described in additional detail herein.

Referring still to FIG. 3, electrical connection to the power electronics device 140 and the first metal layer 122 may be made by the plurality of vias 112. These vias may provide drive signals to the power electronics devices 140, as well as provide a current path for switching current. It is noted that, in some embodiments, some of the vias 112 may be configured as thermal vias that do not conduct drive signals or switching current. For example, the vias 112 shown contacting the first metal layer 122 of the S-cells 121 may be thermally conductive-only vias that are provided to conduct heat flux toward a bottom layer that is close to the cold plate 102. Additionally, thermal vias 112 may be electrically coupled to edges of the second metal layer 124 to move heat flux from the second metal layer 124 down toward the cold plate 102. In this way, heat flux is optimally directed away from the power electronics devices 140 and toward the cold plate 102. As shown in FIG. 3, cold cooling fluid 135 enters the cold plate 102 through the fluid inlet 132, flows through the fluid chamber 115, and exits as warmed cooling fluid out of the fluid outlet 134.

Figure 4:
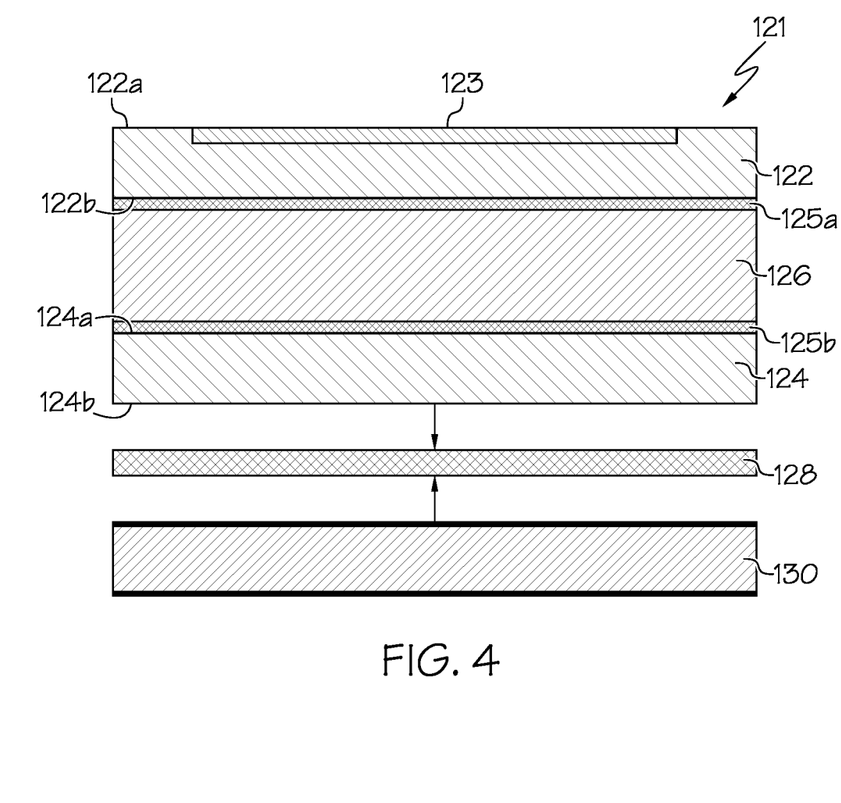
FIG. 4 schematically illustrates a partially exploded cross-sectional view of an example S-cell, according to one or more embodiments described and illustrated herein.

Turning now to FIG. 4, an example S-cell 121 in a partially exploded cross-sectional view is depicted. The S-cell 121 includes a plurality of stacked layers. Particularly, the S-cell 121 illustrated by FIG. 4 may include a first metal layer 122, a second metal layer 124, a first graphite layer 126, a solder layer 128, and an electrically insulating layer 130. In these embodiments, the first metal layer 122 may include a first surface 122a and a second surface 122b opposite the first surface 122a. The first surface 122a may include a recess 123 having dimensions to receive a power electronics device 140. As described in more detail below, the first metal layer 122 provides an electrically conductive surface to which electrically conductive vias may contact to make an electrical connection to electrodes on a bottom surface of the power electronics device. Furthermore, it should be understood that the second metal layer 124 may similarly include a first surface 124a and a second surface 124b opposite the first surface 124a, as will be described in more detail herein.

Referring still to FIG. 4, the first and second metal layers 122, 124 may be made of any suitable metal or alloy. Copper and aluminum may be used as the first and second metal layers 122, 124 as non-limiting examples. Furthermore, as depicted in FIG. 4, the first metal layer 122 and the second metal layer 124 of the S-cell may be bonded to the first graphite layer 126 by a high-temperature active metal brazing method that forms brazing layers 125 (i.e., active metal brazing layers). However, it should be understood that the various layers may be bonded using other known and yet-to-be-developed techniques.

For example, as depicted in FIG. 4, the second surface 122b of the first metal layer 122 may be bonded to the first graphite layer 126 via active metal brazing, such as silver-copper ("AgCu") brazing to form a first brazing layer 125a. Similarly, the first surface 124a of the second metal layer 124 may be bonded to the first graphite layer 126 via metal brazing to form a second brazing layer 125b.

In these embodiments, the first graphite layer 126 may be provided to encourage heat spreading both across the S-cell 121 as well as toward the cold plate 102. The crystalline structure of graphite provides it with high thermal conductivity making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is larger than its width dimension. In these embodiments, the first graphite layer 126 may have high thermal conductivity along the x-axis and the z-axis. Thus, the S-cell 121 is designed such that its dimension along the x-axis is larger than its dimension along the y-axis. Heat flux will travel along the x- and z-axis. In these embodiments, thermal vias may be provided at the edges of the S-cell along the x-axis to receive heat flux and move it toward the cold plate 102. Heat flux will also travel along the z-axis toward the cold plate 102.

Referring still to FIG. 4, the S-cell 121 may further include the solder layer 128. In these embodiments, the solder layer 128 may be disposed on the second surface 124b of the second metal layer 124, and may be used to interface the S-cell 121 with the electrically insulating layer 130. The electrically insulating layer 130 may be made of any material capable of providing electrical insulation between the second metal layer 124 and the plurality of vias 112 of circuit board assembly 106 (FIG. 3). As a non-limiting example, the electrically insulating layer 130 may be made of a ceramic material, such as silicon nitride or aluminum nitride. The material chosen for the electrically insulating layer 130 should have a high thermal conductivity so that heat flux may flow through the electrically insulating layer 130 toward the cold plate 102.

It should be noted that disposal of the solder layer 128 on the second metal layer 124 requires a mild temperature environment (e.g., approximately 300 degrees Celsius) compared to the high-temperature AgCu brazing process used to bond the first and second metal layers 122, 124 to the first graphite layer 126. As a result, thermal stress occurring at the solder layer 128 is minimized, which in turn allows for the overall thickness of the S-cell to be minimized without sacrificing cooling performance (e.g., heat spreading).

Additionally, it should be understood that the mild temperature environment of the solder layer 128 may allow the illustrated S-cell to be asymmetrical in nature (e.g., it is noted that the illustrated S-cell includes a pair of metal layers, a graphite layer, and an electrically insulating layer). For example, although many S-cells may require symmetrical profiles to balance forces acting on the S-cell during the high-temperature bonding process, the relatively lower thermal stress that occurs at the solder layer may allow for the forces acting on the S-cell to be balanced without the need for a symmetrical profile. By allowing the profile of the S-cell to be asymmetrical in nature, additional layers (which would be required by a symmetrical profile and thereby increase the overall thickness of the S-cell) may be eliminated from the S-cell.

Furthermore, by positioning the electrically insulating layer 130 between the second metal layer 124 and the plurality of vias 112 disposed within the circuit board assembly 106, the power electronic devices disposed within the S-cell may be electrically insulated from the bottom layers of the circuit board assembly 106. Accordingly, the structure of the S-cell 121 effectively alleviates the need for a separate electrical insulation layer disposed between the cold plate 102 and the circuit board assembly 106.

Figure 5:
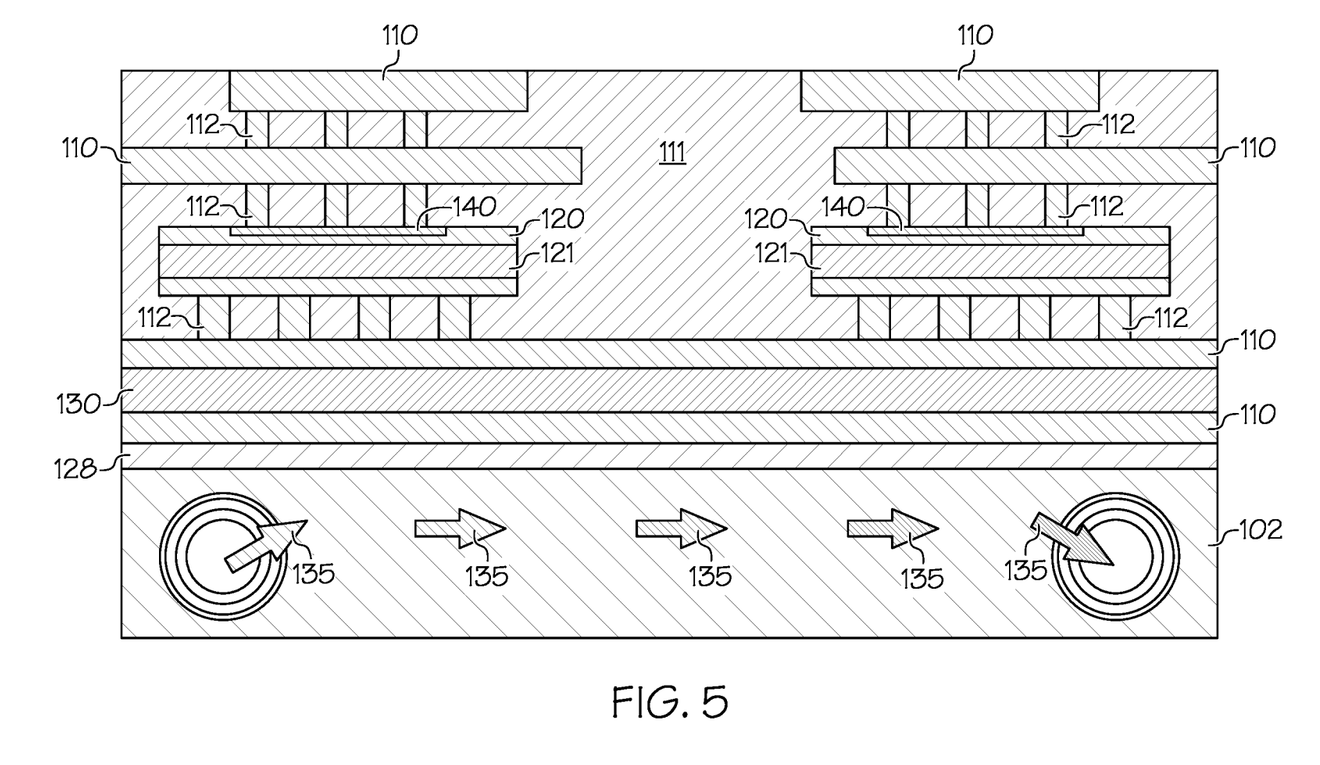
FIG. 5 schematically illustrates a cross-sectional view of another example S-cell, according to one or more embodiments shown and described herein.

Although the structure of the S-cell described with reference to FIGS. 3 and 4 may alleviate the need for a separate electrically insulating layer between the cold plate 102 and the circuit board assembly 106, in some embodiments, the electrically insulating layer 130 may be positioned between the cold plate 102 and the circuit board assembly 106 rather than within the S-cell 121, as is depicted in FIG. 5. In these embodiments, the S-cell 121 may include the first metal layer 122, second metal layer 124, and first graphite layer 126, as has been described with reference to FIGS. 3 and 4. However, the electrically insulating layer 130 may be deposited between the cold plate 102 and the circuit board assembly 106, rather between the second metal layer 124 and the plurality of vias 112.

By placing the electrically insulating layer 130 between the circuit board assembly 106 and the cold plate 102, the need for the solder layer 128 disposed on the second metal layer 124 may be alleviated. However, it should be noted that the thermal performance of the power electronics assembly 100 may be highly dependent on the thermal conductivity of the electrical insulation material used to form the substrate 111. For example, utilization of common insulation material, such as FR-4 or other similar material, in the power electronics assembly 100 depicted in FIG. 5 may negatively impact the cooling performance of the power electronics assembly 100, such that the maximum temperature achieved by the power electronics assembly 100 exceeds a predetermined threshold. However, high thermally conductive dielectric material, which is commercially available at higher costs, may be utilized in place of common insulation material in order to achieve similar performance to the power electronics assembly 100 depicted in FIGS. 3 and 4.

It should now be understood that embodiments of the present disclosure are directed to circuit board assemblies, power electronics device assemblies, and power electronics assemblies comprising an S-cell that is fully embedded within a circuit board substrate. The S-cells of the embodiments described herein include a first graphite layer to improve thermal performance, as well as first and second metal layers coupled to the first graphite layer. The S-cells further include a solder layer disposed on the second metal layer, which is coupled to an electrically insulating layer. It should be understood that the presence of the solder layer may allow for the disclosed S-cells to be asymmetrical in nature, such that additional layers which would be required by symmetrical S-cells are eliminated. Accordingly the elimination of additional layers may allow for the S-cells disclosed herein to be thinner in nature without sacrificing heat spreading performance.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

What is claimed:

1. A power electronics device assembly comprising:
   an S-cell comprising:
      a first metal layer comprising a first surface having a recess;
      a graphite layer bonded to the first metal layer;
      a second metal layer bonded to the graphite layer;
      a solder layer disposed on the second metal layer; and
      an electrically insulating layer bonded to the solder layer; and
   a power electronics device disposed within the recess of the first surface of the first metal layer.

2. The power electronics device assembly of claim 1, wherein the electrically insulating layer is made from silicon nitride.

3. The power electronics device assembly of claim 1, wherein the S-cell has a length that is greater than a width.

4. The power electronics device assembly of claim 1, further comprising:
   a first brazing layer between the first metal layer and the graphite layer; and
   a second brazing layer between the second metal layer and the graphite layer.

5. A circuit board assembly comprising:
   a substrate that is electrically insulating;
   a power electronics device assembly fully embedded in the substrate, the power electronics device assembly comprising:
      an S-cell comprising:
         a first metal layer comprising a first surface having a recess;
         a graphite layer bonded to the first metal layer;
         a second metal layer bonded to the graphite layer;
         a solder layer disposed on the second metal layer; and
         an electrically insulating layer bonded to the solder layer; and
      a power electronics device disposed within the recess of the first surface of the first metal layer.

6. The circuit board assembly of claim 5, further comprising a plurality of electrically conductive layers embedded within the substrate.

7. The circuit board assembly of claim 5, further comprising a plurality of vias embedded in the substrate and thermally coupled to the power electronics device.

8. The circuit board assembly of claim 5, wherein the electrically insulating layer is made from silicon nitride.

9. The circuit board assembly of claim 5, wherein the S-cell has a length that is greater than a width.

10. The circuit board assembly of claim 5, wherein the S-cell further comprises:
    a first brazing layer between the first metal layer and the graphite layer; and
    a second brazing layer between the second metal layer and the graphite layer.

11. A power electronics assembly comprising:
    a cold plate; and
    a circuit board assembly affixed to a first surface of the cold plate, the circuit board assembly comprising:
       a substrate that is electrically insulating;
       a power electronics device assembly fully embedded in the substrate, the power electronics device assembly comprising:
          an S-cell comprising:
             a first metal layer comprising a first surface having a recess;
             a graphite layer bonded to the first metal layer;
             a second metal layer bonded to the graphite layer;
             a solder layer disposed on the second metal layer; and
             an electrically insulating layer bonded to the solder layer; and
          a power electronics device disposed within the recess of the first surface of the first metal layer.

12. The power electronics assembly of claim 11, wherein the circuit board assembly is affixed to the first surface of the cold plate by a bond layer.

13. The power electronics assembly of claim 11, wherein the circuit board assembly is affixed to the first surface of the cold plate by fasteners and a thermal grease layer.

14. The power electronics assembly of claim 11, wherein the S-cell includes an asymmetrical profile.

15. The power electronics assembly of claim 11, wherein;
    the cold plate comprises a fluid chamber, a fluid inlet, and a fluid outlet; and
    the fluid inlet and the fluid outlet are thermally coupled to the fluid chamber.

16. The power electronics assembly of claim 11, wherein the circuit board assembly further comprises a plurality of electrically conductive layers embedded within the substrate.

17. The power electronics assembly of claim 11, wherein the circuit board assembly further comprises a plurality of vias embedded in the substrate and thermally coupled to the power electronics device.

18. The power electronics assembly of claim 11, wherein the electrically insulating layer is made from silicon nitride.

19. The power electronics assembly of claim 11, wherein the S-cell has a length that is greater than a width.

20. The power electronics assembly of claim 11, wherein the S-cell further comprises:
   a first brazing layer between the first metal layer and the graphite layer; and
   a second brazing layer between the second metal layer and the graphite layer.

\* \* \* \* \*